(12) United States Patent
Possanzini (10) Patent No.: US 7,804,300 B2
(45) Date of Patent: Sep. 28, 2010

(54) COMPACT AND FLEXIBLE RADIO FREQUENCY COIL ARRAYS

(75) Inventor: Cecilia Possanzini, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 77 days.

(21) Appl. No.: 12/089,718

(22) PCT Filed: Sep. 15, 2006

(86) PCT No.: PCT/IB2006/053319

§ 371 (c)(1),
(2), (4) Date: Apr. 10, 2008

(87) PCT Pub. No.: WO2007/046014

PCT Pub. Date: Apr. 26, 2007

(65) Prior Publication Data

US 2008/0238424 A1    Oct. 2, 2008

Related U.S. Application Data

(60) Provisional application No. 60/728,378, filed on Oct. 19, 2005.

(51) Int. Cl.
    *G01V 3/00* (2006.01)
(52) U.S. Cl. ..................................... 324/318
(58) Field of Classification Search .......... 324/300–322
    See application file for complete search history.

(56) References Cited

U.S. PATENT DOCUMENTS

| | | | |
|---|---|---|---|
| 4,793,356 A | 12/1988 | Misic et al. | |
| 5,296,813 A | 3/1994 | Holmes et al. | |
| 5,545,999 A | 8/1996 | Mueller et al. | |
| 6,150,816 A | 11/2000 | Srinivasan | |
| 6,822,450 B2 | 11/2004 | Klinge et al. | |
| 6,876,197 B2 * | 4/2005 | Albrecht et al. | 324/307 |
| 6,876,199 B2 * | 4/2005 | Hardy et al. | 324/309 |
| 6,977,502 B1 * | 12/2005 | Hertz | 324/318 |
| 7,279,893 B1 * | 10/2007 | Marinelli et al. | 324/307 |
| 7,365,542 B1 * | 4/2008 | Rohling et al. | 324/318 |

(Continued)

FOREIGN PATENT DOCUMENTS

EP    1521094 A1    4/2005

(Continued)

OTHER PUBLICATIONS

Beck, B. L., et al.; Phased array imaging on small animal research systems; 2001; Proc. Intl. Soc. Mag. Reson. Med.; 9:1111.

(Continued)

*Primary Examiner*—Brij B Shrivastav
*Assistant Examiner*—Dixomara Vargas (57) ABSTRACT

A radio frequency coils array includes a plurality of conductive RF loops (62a, 62b, 62c, 62d, 162a, 162b, 262a, 262b, 362a, 362b, 362c, 462a, 462b, 462c, 562a, 562b) configured to excite or receive magnetic resonance signals, and a plurality of electronics modules (64a, 64b, 64c, 64d, 164a, 164b, 264a, 264b, 364a, 364b, 364c, 464a, 464b, 64c, 564a, 564b) corresponding to the plurality of conductive RF loops. The electronics modules are grouped together in a compact electronics region (66, 166, 266, 366, 466, 66). Each RF coil is operatively connected with a corresponding electronics module. Each electronics module includes at least a pre-amplifier.

21 Claims, 7 Drawing Sheets

U.S. PATENT DOCUMENTS

| | | | |
|---|---|---|---|
| 7,408,349 B1 * | 8/2008 | Hertz | 324/318 |
| 7,443,165 B2 * | 10/2008 | Varjo | 324/322 |
| 2005/0062472 A1 | 3/2005 | Bottomley | |

FOREIGN PATENT DOCUMENTS

| | | | |
|---|---|---|---|
| WO | 2005052621 A1 | 6/2005 | |

OTHER PUBLICATIONS

Leussler, C., et al.; Intrinsic Hybrid Surface Coil Array for Improved SNR in Cardiac MRI; 2002; Proc. Intl. Soc. Mag. Reson. Med.; 10.

Ordidge, R. J., et al.; High resolution imaging at 4.7 T using four irregularly-shaped receiver coils; 2004; Proc. Intl. Soc. Mag. Reson. Med.; 11:1557.

* cited by examiner

COMPACT AND FLEXIBLE RADIO FREQUENCY COIL ARRAYS

CROSS REFERENCE TO RELATED APPLICATIONS

This application claims the benefit of U.S. provisional application Ser. No. 60/728,378 filed Oct. 19, 2005, which is incorporated herein by reference.

DESCRIPTION

The following relates to the magnetic resonance arts. It finds particular application in arrays of radio frequency coils for magnetic resonance imaging, and will be described with particular reference thereto. It finds application more generally in conjunction with magnetic resonance imaging, magnetic resonance spectroscopy, and other magnetic resonance applications.

Magnetic resonance techniques increasingly employ arrays of surface coils for transmitting and receiving magnetic resonance. For example, sensitivity encoding (SENSE) imaging techniques employ a plurality of coils of different coil sensitivities in conjunction with undersampling of k-space. The undersampling causes the image acquired by each coil to be "folded" and at a low resolution. During post-acquisition processing the folded images are unfolded and combined to produce a high resolution unfolded image. Other parallel imaging techniques make other uses of the parallel acquisition of imaging data using an array of coils. Magnetic resonance spectroscopy techniques can also employ arrays of surface coils to advantage.

For such applications, each surface coil of the array typically includes a conductive RF loop, and on-board electronics providing features such as: frequency matching with the magnetic resonance frequency; a pre-amplifier for amplifying the received magnetic resonance signal; coil detuning during the transmit phase of the magnetic resonance sequence; trapping of common mode signals; or so forth. The on-board electronics are typically disposed on a small printed circuit board positioned close to the conductive RF loop. For performance reasons, the distance between certain electronics, such as the pre-amplifier, and the conductive RF loop should be as small as practicable.

Difficulty can arise in arranging an array of such surface coils in close vicinity to an imaging subject. For example, if the torso is to be imaged, each surface coil should be disposed on the torso, or at least should be in close proximity to the torso. Individual positioning of each coil of an array of surface coils is time consuming, and movement of any of the coils during magnetic resonance data acquisition can adversely affect the resulting images, spectroscopic analysis, or other magnetic resonance results. Connection of each surface coil with the RF receiver entails running a large number of RF cables between the surface coils disposed at the imaging subject and the RF receiver. The RF cables can introduce conductive RF loops that produce image distortion, eddy current heating, and other problems.

One approach for mitigating these problems is to dispose the surface coils on or in a fabric-based or other flexible substrate. This can simplify placement of the surface coils, and some internal cabling can be embedded into the fabric, which simplifies the preparation process. However, separate RF cables connect each surface coil, which can lead to RF loops, image distortion, eddy currents, and so forth. Also, the individual coils disposed on or in the flexible fabric can move during imaging, thus adversely affecting the magnetic resonance acquisition.

In another approach, the array of surface coils is mounted on a large common printed circuit board. This approach enables positioning of the entire array in a single step, and enables cabling using microstrips or other shielded RF printed circuitry disposed on the printed circuit board. Moreover, the electronics for each surface coil are conveniently disposed on the common printed circuit board. The rigid common printed circuit board reduces the likelihood of movement of the coils during imaging.

Unfortunately, the relative rigidity of the common printed circuit board reduces the flexibility of placement of individual surface coils. In some approaches, the common printed circuit board is shaped to match a contour of the subject. This approach limits the usefulness of the coil array to subjects having that contour. In other approaches, a semi-rigid common printed circuit board is employed to provide some limited flexibility in coil placement. In other approaches, a plurality of common printed circuit boards connected by flexible hinges are used. Each common printed circuit board supports a sub-set of surface coils. The hinges provide improved flexibility in coil placement, especially for wrapping an array of surface coils around an arm, leg, or other generally linear subject. However, it is difficult to provide flexibility in two transverse directions using this approach.

Moreover, even when microstrips or other RF printed circuitry is used for the cabling in conjunction with a common printed circuit board, problems with RF loops, eddy currents, and so forth can still arise.

The following contemplates improvements that overcome the aforementioned limitations and others.

According to one aspect, a radio frequency coils array is disclosed. A plurality of conductive RF loops 62a, 62b, 62c, 62d, 162a, 162b, 262a, 262b, 362a, 362b, 362c, 462a, 462b, 462c, 562a, 562b are configured to excite or receive magnetic resonance signals. A plurality of electronics modules 64a, 64b, 64c, 64d, 164a, 164b, 264a, 264b, 364a, 364b, 364c, 464a, 464b, 464c, 564a, 564b correspond to the plurality of conductive RF loops. The electronics modules are grouped together in a compact electronics region 66, 166, 266, 366, 466, 566. Each conductive RF loop is operatively connected with a corresponding electronics module. Each electronics module includes at least a pre-amplifier PA.

According to another aspect, the aforementioned plurality of conductive RF loops and corresponding plurality of electronics modules define a coils module, and the radio frequency coils array further includes a plurality of said coils modules spatially arranged to define the radio frequency coils array.

According to another aspect, a magnetic resonance system is disclosed. A main magnet produces a static $B_0$ magnetic field. Magnetic field gradient coils superimpose selected magnetic field gradients on the static $B_0$ magnetic field. A radio frequency coils array as set forth in either one of the two preceding paragraphs is provided.

One advantage resides in reducing undesirable RF loops.

Another advantage resides in more efficient trapping of common mode signals on coil cables.

Another advantage resides in more compact electronic modules for coil arrays.

Another advantage resides in providing coil arrays with improved flexibility.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
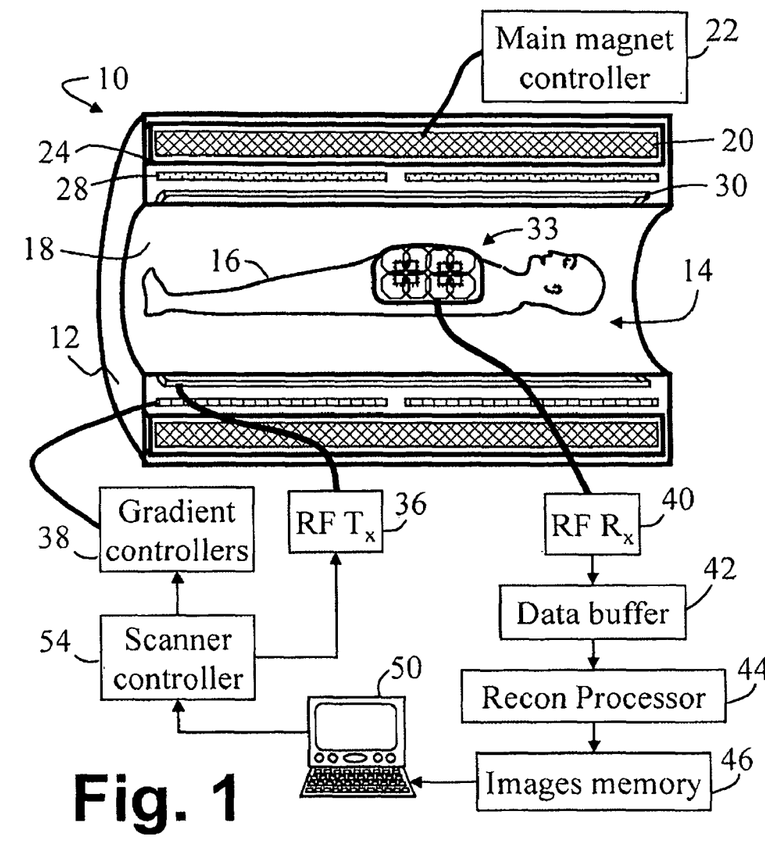
FIG. 1 diagrammatically shows a magnetic resonance system including a coil array.

With reference to FIG. 1, a magnetic resonance scanner 10 includes a scanner housing 12 including a bore 14 or other receiving region for receiving a patient or other subject 16. A main magnet 20 disposed in the scanner housing 12 is controlled by a main magnet controller 22 to generate a main $B_0$ magnetic field at least in a region of interest of the bore 14. Typically, the main magnet 20 is a persistent superconducting magnet surrounded by cryoshrouding 24, although a resistive, permanent, or other type of main magnet can be used.

Magnetic field gradient coils 28 are arranged in or on the housing 12 to superimpose selected magnetic field gradients on the main magnetic field at least in a region of interest. Typically, the magnetic field gradient coils include coils for producing three orthogonal magnetic field gradients, such as an x-gradient, y-gradient, and z-gradient. A whole-body radio frequency coil 30 is optionally disposed in housing 12, as shown, or in the bore 14 of the scanner 10, to inject $B_1$ radio frequency excitation pulses. A radio frequency coils array 33 is disposed in the bore 14 for receiving magnetic resonances excited by the whole-body coil 30. In some embodiments, a local coil or coil array such as the coils array 33 is also used for magnetic resonance excitation, in which case the whole-body coil 30 is optionally omitted.

During magnetic resonance data acquisition, a radio frequency transmitter 36 is coupled to the whole-body radio frequency coil 30 as shown, or to the coils array 33, to generate magnetic resonance signals in a region of interest of a subject disposed in the bore 14. A magnetic field gradients controller 38 operates the magnetic field gradient coils 28 to spatially localize, spatially encode, or otherwise manipulate the generated magnetic resonances. During the magnetic resonance readout phase, a radio frequency receiver 40 coupled with the coil array 33 receives magnetic resonance signals, samples of which are stored in a data buffer 42. The received magnetic resonance samples are processed to produce information of interest. For example, if the magnetic resonance sequence is an imaging sequence that includes spatial encoding by magnetic field gradients, then a reconstruction processor 44 suitably processes the spatially encoded magnetic resonance samples using a Fourier transform reconstruction, backprojection reconstruction, or other reconstruction comporting with the spatial encoding to generate a reconstructed image that is stored in an images memory 46. If the magnetic resonance sequence is a spectroscopy sequence then suitable post-acquisition processing may include, for example, spectral filtering or binning.

A user interface 50 displays the reconstructed image or other processed data representation to a user. In the example embodiment illustrated in FIG. 1, the user interface 50 also interfaces the user with a scanner controller 54 to control the magnetic resonance scanner 10. In other embodiments, a separate scanner control interface may be provided. It is to be appreciated that various illustrated components can be integrated in various ways. For example, if the user interface 50 is a computer, then the reconstruction processor 44, scanner controller 54, data memories 42, 46, or other components are optionally integrated with the user interface 50 as software components, non-volatile memory units, or so forth.

Figure 2A:
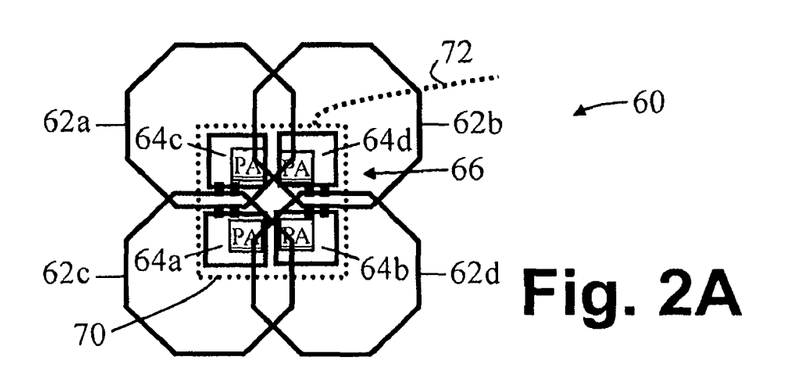
FIG. 2A diagrammatically shows a coils module of the coil array of FIG. 1, which coils module includes four independent RF coils.
Figure 2B:
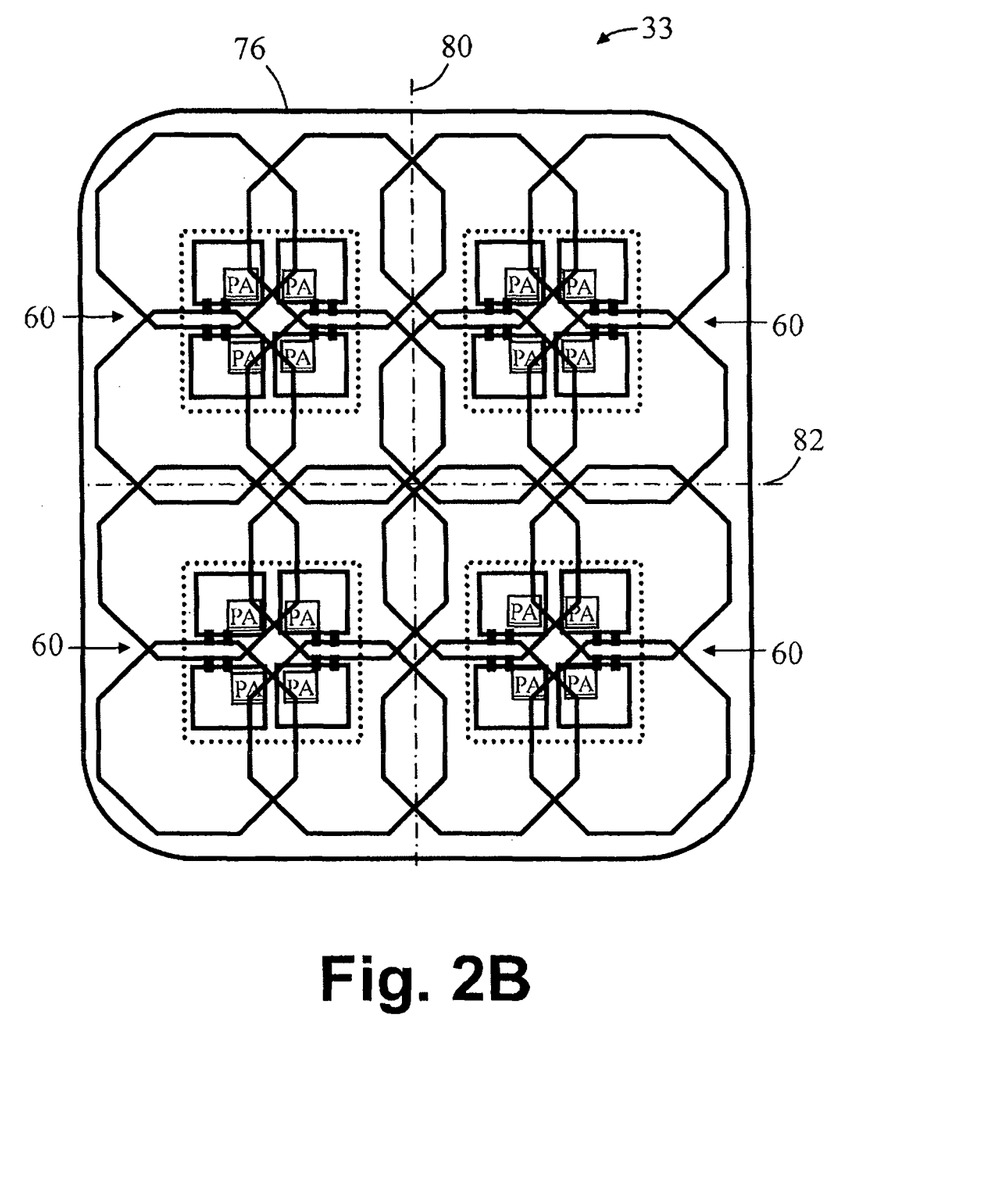
FIG. 2B diagrammatically shows a sixteen element coil array.

With reference to FIGS. 2A and 2B, the radio frequency coils array 33 is constructed as a spatial arrangement of a plurality of coils modules 60. As best seen in FIG. 2B, the example coils array 33 includes four coils modules 60, one of which is depicted in FIG. 2A. The example coils module 60 includes four conductive RF loops 62a, 62b, 62c, 62d configured to excite or receive magnetic resonance signals. The four conductive RF loops 62a, 62b, 62c, 62d are arranged as a 2×2 array. Each of the conductive RF loops 62a, 62b, 62c, 62d has a corresponding electronics module 64a, 64b, 64c, 64d disposed in a compact common electronics region 66 centrally located respective to the 2×2 array of conductive RF loops 62a, 62b, 62c, 62d. The four electronics modules 64a, 64b, 64c, 64d are arranged as a 2×2 array in the compact electronics region 66.

The electronics module 64a is coupled with the conductive RF loop 62a. The electronics module 64b is coupled with the conductive RF loop 62b. The electronics module 64c is coupled with the conductive RF loop 62c. The electronics module 64d is coupled with the conductive RF loop 62d. The four conductive RF loops 62a, 62b, 62c, 62d and the corresponding four electronics modules 64a, 64b, 64c, 64d define a corresponding four operatively independent radio frequency coils of the coils module 60.

In some embodiments, the four electronics modules 64a, 64b, 64c, 64d of the coils module 60 are supported by a common printed circuit board 70 (drawn using dotted lines) disposed in the compact electronics region 66, and a common radio frequency cable 72 (drawn using a dotted line) extends from the compact electronics region 66. The RF cable 72 defines a plurality of conductive radio frequency paths corresponding to the plurality of conductive RF loops 62a, 62b, 62c, 62d. Each radio frequency path of the RF cable 72 connects with one of the electronics modules 64a, 64b, 64c, 64d to conduct an RF signal corresponding to a magnetic resonance signal received by the corresponding conductive RF loop 62a, 62b, 62c, 62d. The cables can conduct analog RF signals or, of the electronics modules 64a, 64b, 64c, 64d include digitizing circuitry, can conduct digital signals. If the coils array 33 is used during the transmit phase to excite magnetic resonance, then the RF cable 72 suitably conducts a radio frequency signal corresponding to radio frequency excitation delivered to the RF loop 62a, 62b, 62c, 62d. In other embodiments, each of the electronics modules 64a, 64b, 64c, 64d has its own printed circuit board or other supporting substrate, and has its own associated RF cable.

As seen in FIG. 2B, the example radio frequency coil array 33 is constructed as a 2×2 array of four partially overlapping coils modules 60 disposed on or in a fabric or other flexible substrate 76. Since each coils module 60 includes four operatively independent radio frequency coils, the 2×2 array of partially overlapping coils modules 60, for example with the coil loops overlapped at a position of minimum mutual inductance, includes sixteen operatively independent radio frequency coils. Other radio frequency coil arrays can be constructed including more or fewer coils modules 60. In some embodiments, the coils modules 60 are not overlapping. The arrangement can in general be any n×m array of coils modules 60 where n and m are integers, or can be a non-rectangular arrangement of a plurality of coils modules 60. If only four operatively independent radio frequency coils are desired, then the radio frequency coil array can consist of a single coils module 60. Other larger and smaller arrays, non-square arrays, and so forth are also contemplated.

The selected arrangement of coils modules 60 disposed on or in the flexible substrate 76 optionally provides flex axes at gaps between the coils modules 60 defining portions of the RF coil array that are flexible. Considering the example RF coil array 33 shown in FIG. 2B, gaps between the 2×2 array of four partially overlapping coils modules 60 define two transverse flex axes 80, 82 across which the radio frequency coils array 33 is flexible. As shown in example FIG. 1, these flex axes 80, 82 enable, for example, the RF coil array 33 to substantially conform with the shape of a torso of a human subject 16. Additional flexibility can be achieved by, for example, making the optional common printed circuit boards 70 of a semi-rigid material. However, given that the printed circuit boards 70 support electronics, the flexibility of the semi-rigid printed circuit board is limited. If each of the electronics modules 64a, 64b, 64c, 64d has its own printed circuit board or other supporting substrate, then increased flexibility may be achieved; however, construction complexity is increased by providing separate supports for each electronics module.

Figure 3A:
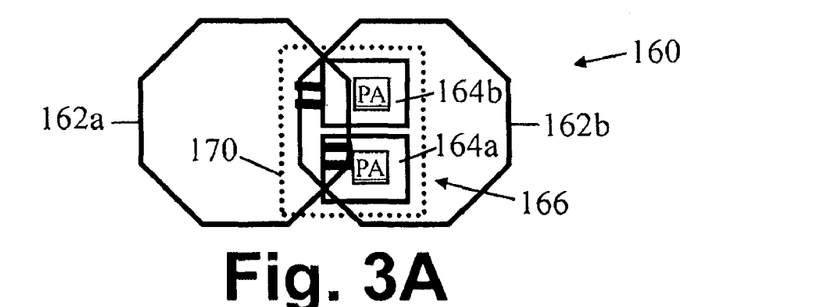
FIG. 3A diagrammatically shows a coils module which includes two independent RF coils.
Figure 3B:
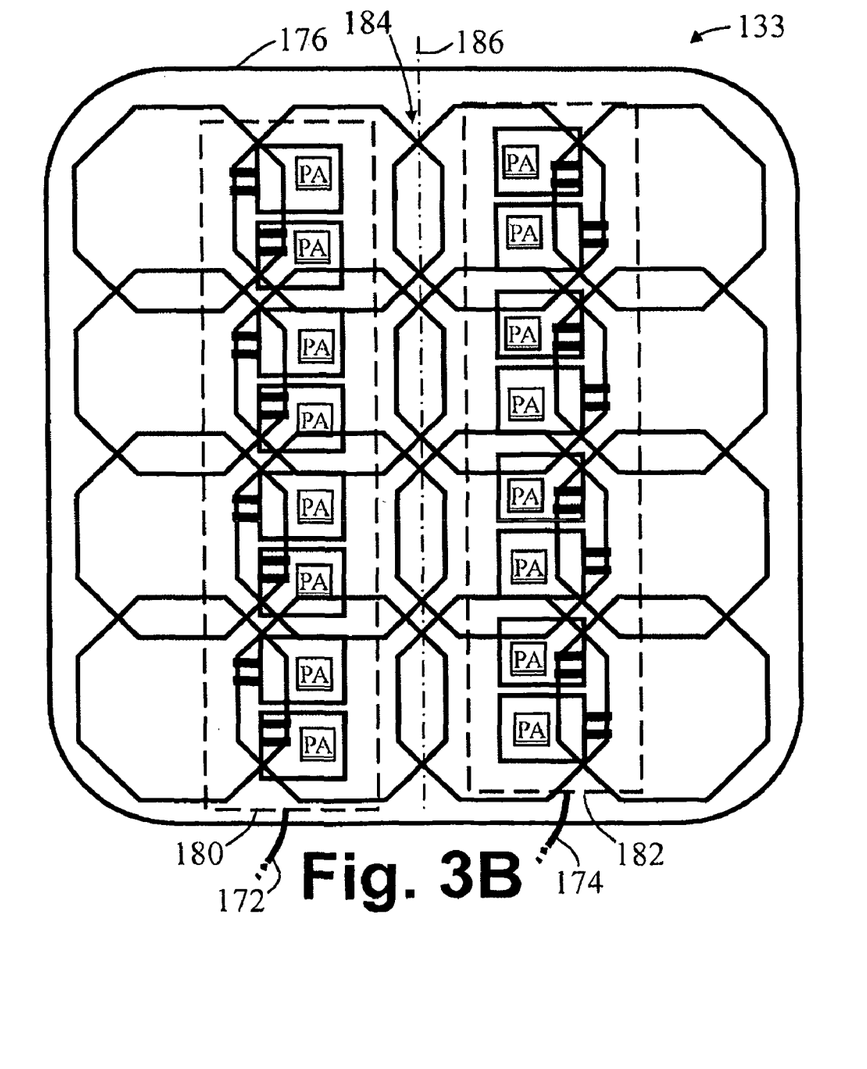
FIG. 3B diagrammatically shows a sixteen element coil array constructed using a 2×4 array of the coils modules of FIG. 3A, in which four coils modules are arranged with their electronics modules on a first printed circuit board and four coils modules are arranged with their electronics modules on a second spaced apart parallel printed circuit board.

With reference to FIGS. 3A and 3B, another example RF coil array 133 as a spatial arrangement of a plurality of coils modules 160. The example coils array 133 shown in FIG. 3B includes six coils modules 160, one of which is depicted in FIG. 3A. The example coils module 160 includes two conductive RF loops 162a, 162b configured to excite or receive magnetic resonance signals. The two conductive RF loops 162a, 162b are arranged as a linear array. Each of the conductive RF loops 162a, 162b has a corresponding electronics module 164a, 164b disposed in a compact electronics region 166 located within the linear array of conductive RF loops 162a, 162b. The two electronics modules 164a, 164b are arranged linearly in the compact electronics region 166 in a direction transverse to the linear array of the conductive RF loops 162a, 162b.

The electronics module 164a is coupled with the conductive RF loop 162a. The electronics module 164b is coupled with the conductive RF loop 162b. The two conductive RF loops 162a, 162b and the corresponding two electronics modules 164a, 164b define a corresponding two operatively independent radio frequency coils of the coils module 160. In some embodiments, the two electronics modules 164a, 164b of the coils module 160 are supported by a common printed circuit board 170 (drawn using dotted lines) disposed in the compact electronics region 166. In other embodiments, each of the two electronics modules 164a, 164b has its own printed circuit board or other supporting substrate, or is supported by common printed circuit boards as illustrated in FIG. 3B.

As seen in FIG. 3B, the example radio frequency coil array 133 is constructed as a 2×4 array of eight partially overlapping coils modules 160 disposed on or in a fabric or other flexible substrate 176. Since each coils module 160 includes two operatively independent radio frequency coils, the 2×4 array of partially overlapping coils modules 160 includes sixteen operatively independent radio frequency coils. Other radio frequency coil arrays can be constructed including more or fewer coils modules 160. In some embodiments, the coils modules 160 are not overlapping. The arrangement can in general be any n×m array of coils modules 160 where n and m are integers, or can be a non-rectangular arrangement of a plurality of coils modules 160. If only two operatively independent radio frequency coils are desired, then the radio frequency coil array can consist of a single coils module 160.

In the 2×4 arrangement of coils modules 160, a first printed circuit board 180 (drawn using dashed lines) optionally spans the compact electronics regions of four neighboring coils modules 160 and supports the electronics modules of the those four coils modules, while a second printed circuit board 182 spaced apart from the first printed circuit board 180 spans the compact electronics regions of four other neighboring coils modules 160 and supports the electronics modules of those four other neighboring coils modules 160. A gap 184 is present between the first and second printed circuit boards 180, 182 that defines a flexible portion of the radio frequency coils array 133 that can be flexed along a flex axis 186. RF cables 172, 174 can conveniently extend from the circuit boards 180, 182, respectively.

Figure 4A:
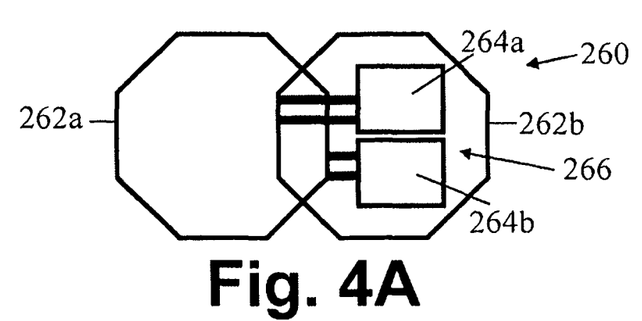
FIG. 4A diagrammatically shows a coils module which includes two independent RF coils.
Figure 4B:
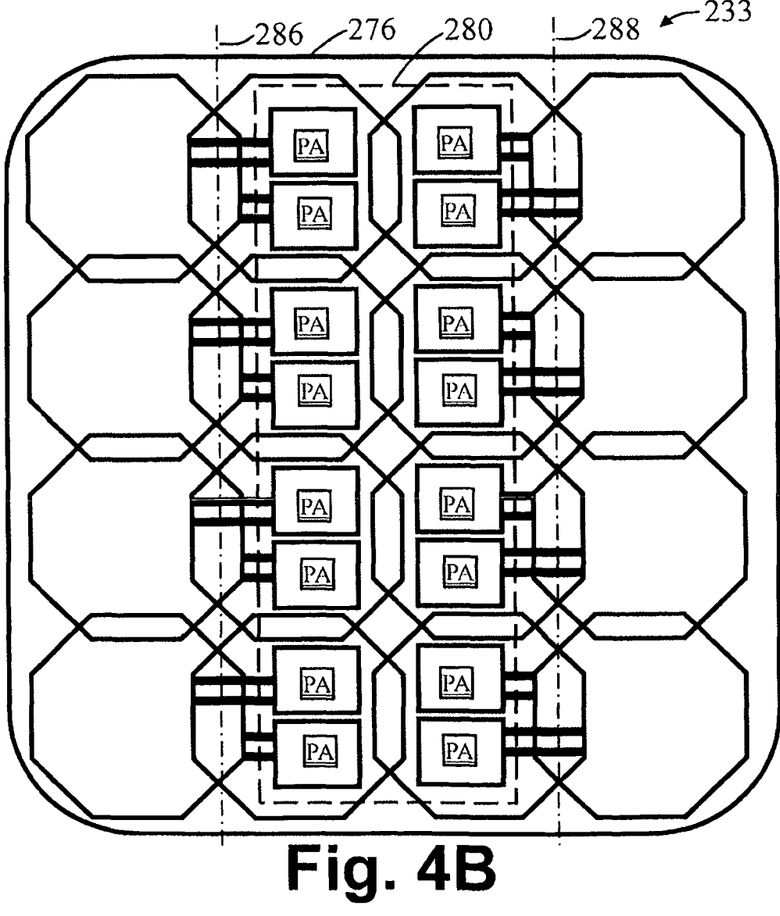
FIG. 4B diagrammatically shows a sixteen element coil array constructed using a 2×4 array of the coils modules of FIG. 4A, in which the coils modules are arranged with the electronics modules of all eight coils modules disposed on a single central printed circuit board.

With reference to FIGS. 4A and 4B, another example RF coil array 233 as a spatial arrangement of a plurality of coils modules 260. The example coils array 233 shown in FIG. 4B includes six coils modules 260, one of which is depicted in FIG. 4A. The example coils module 260 includes two conductive RF loops 262a, 262b configured to excite or receive magnetic resonance signals. The two conductive RF loops 262a, 262b are arranged as a linear array. Each of the conductive RF loops 262a, 262b has a corresponding electronics module 264a, 264b disposed in a compact electronics region 266 located within the linear array of conductive RF loops 262a, 262b. The two electronics modules 264a, 264b are arranged linearly in the compact electronics region 266 in a direction transverse to the linear array of the conductive RF loops 262a, 262b.

The electronics module 264a is coupled with the conductive RF loop 262a. The electronics module 264b is coupled with the conductive RF loop 262b. The two conductive RF loops 262a, 262b and the corresponding two electronics modules 264a, 264b define a corresponding two operatively independent radio frequency coils of the coils module 260. As seen in FIG. 4B, the example radio frequency coil array 233 is constructed as a 2×4 array of eight partially overlapping coils modules 260 disposed on or in a fabric or other flexible substrate 276. In other embodiments, other numbers of coils modules 260 can be assembled with an array of the same or different geometry. Since each coils module 260 includes two operatively independent radio frequency coils, the 2×4 array of partially overlapping coils modules 260 includes sixteen operatively independent radio frequency coils. Other radio frequency coil arrays can be constructed including more or fewer coils modules 260. In some embodiments, the coils modules 260 are not overlapping. In the 2×4 arrangement of coils modules 260, a single common printed circuit board 280 (drawn using dashed lines) optionally spans the compact electronics regions of all eight coils modules 260 and supports the electronics modules of the those four coils modules. The coils array 133 is flexible along or beyond two parallel flex axes 286, 288 located on either side of the printed circuit board 280.

Figure 5A:
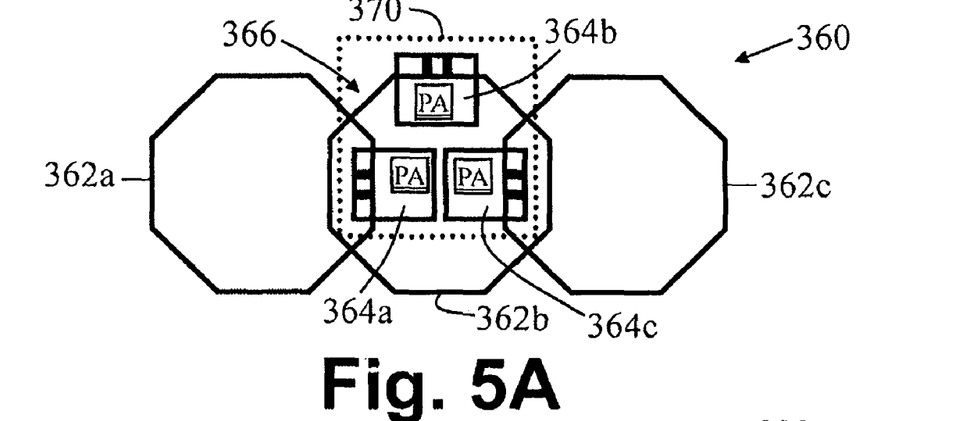
FIG. 5A diagrammatically shows a coils module which includes three independent RF coils.
Figure 5B:
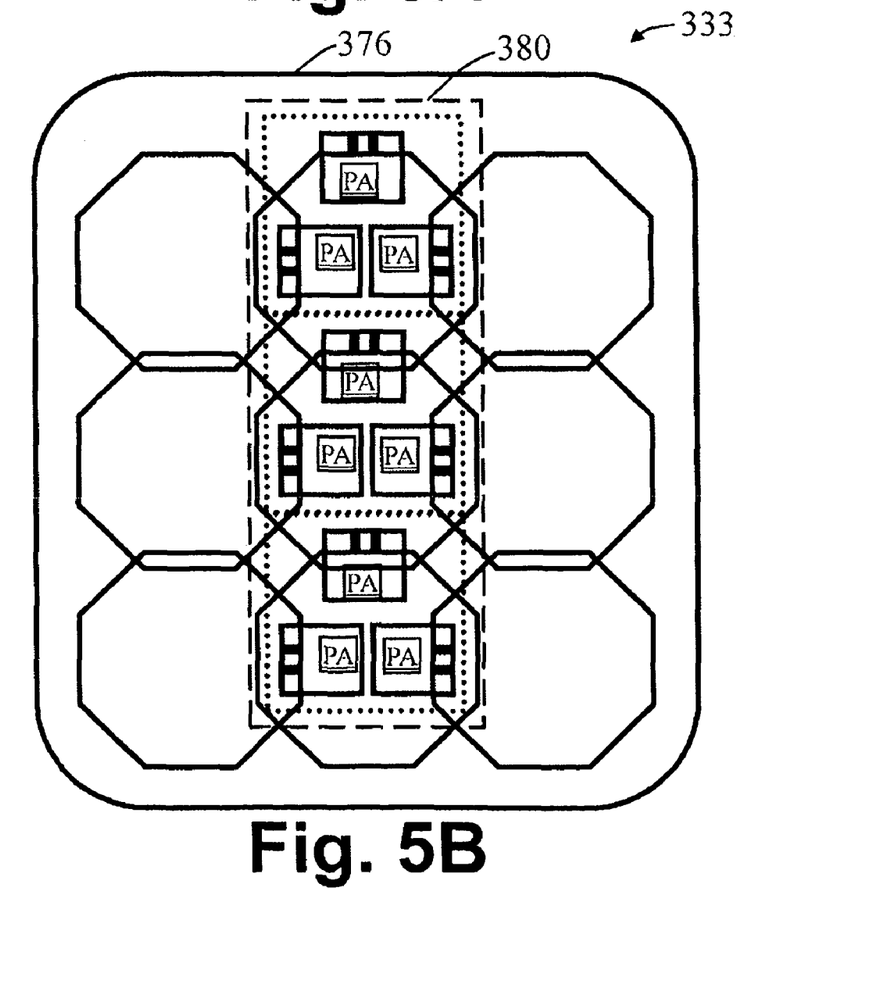
FIG. 5B diagrammatically shows a nine element coil array constructed using a 1×3 array of the coils modules of FIG. 5A, in which the coils modules are arranged with the electronics modules of all three coils modules disposed on a single central printed circuit board.

With reference to FIGS. 5A and 5B, another example RF coil array 333 as a spatial arrangement of a plurality of coils modules 360. The example coils array 333 shown in FIG. 5B includes nine coils modules 360, one of which is depicted in FIG. 5A. The example coils module 360 includes three conductive RF loops 362a, 362b, 362c configured to excite or receive magnetic resonance signals. The three conductive RF loops 362a, 362b, 362c are arranged as a linear array. Each of the conductive RF loops 362a, 362b, 362c has a corresponding electronics module 364a, 364b, 364c disposed in a compact electronics region 366 located within the linear array of conductive RF loops 362a, 362b, 362c. The three electronics modules 364a, 364b, 364c are arranged compactly in the compact electronics region 266. The electronics module 364a is coupled with the conductive RF loop 362a. The electronics module 364b is coupled with the conductive RF loop 362b. The electronics module 364c is coupled with the conductive RF loop 362c. The three conductive RF loops 362a, 362b, 362c and the corresponding three electronics modules 364a, 364b, 364c define a corresponding three operatively independent radio frequency coils of the coils module 360. In some embodiments, the three electronics modules 364a, 364b, 364c of the coils module 360 are supported by a common printed circuit board 370 (drawn using dotted lines) disposed in the compact electronics region 366. In other embodiments, each of the three electronics modules 364a, 364b, 364c has its own printed circuit board or other supporting substrate, or is supported by a common printed circuit board as illustrated in FIG. 5B.

As seen in FIG. 5B, the example radio frequency coil array 333 is constructed as a linear array of three partially overlapping coils modules 360 disposed on or in a fabric or other flexible substrate 376. Since each coils module 360 includes three operatively independent radio frequency coils, the linear array of three partially overlapping coils modules 360 includes nine operatively independent radio frequency coils. Other radio frequency coil arrays can be constructed including more or fewer coils modules 360. Instead of the illustrated linear array, a two-dimensional array of coils modules 360 can be constructed. In some embodiments, the coils modules 360 are not overlapping. In the linear arrangement of coils modules 360, a single common printed circuit board 380 (drawn using dashed lines) optionally spans the compact electronics regions of all three coils modules 360 and supports the electronics modules of the those three coils modules.

Figure 6A:
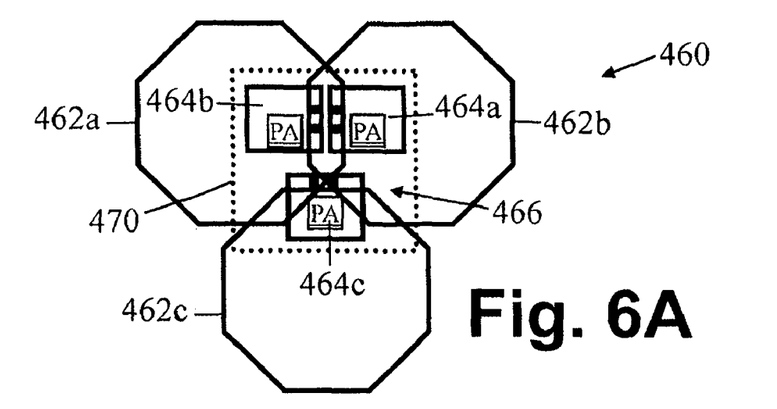
FIG. 6A diagrammatically shows a coils module which includes three independent RF coils.
Figure 6B:
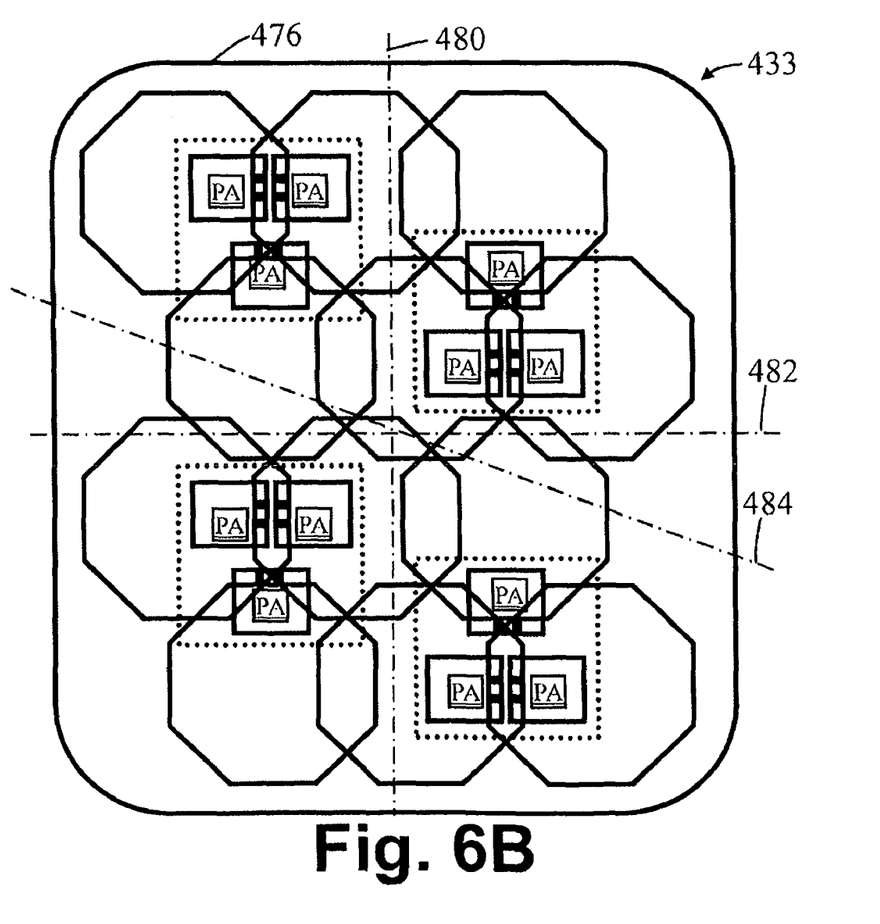
FIG. 6B diagrammatically shows a twelve element coil array constructed using a staggered 2×2 array of the coils modules of FIG. 6A.

With reference to FIGS. 6A and 6B, another example of an RF coil array 433 as a spatial arrangement of a plurality of coils modules 460 is illustrated. The example coils array 433 shown in FIG. 6B includes four coils modules 460, one of which is depicted in FIG. 6A. The coils module 460 of the example includes three conductive RF loops 462a, 462b, 462c configured to excite or receive magnetic resonance signals. The three conductive RF loops 462a, 462b, 462c are arranged partially overlapping in an triangular arrangement. Each of the conductive RF loops 462a, 462b, 462c has a corresponding electronics module 464a, 464b, 464c disposed in a compact electronics region 466 located within the linear array of conductive RF loops 462a, 462b, 462c. The three electronics modules 464a, 464b, 464c are arranged compactly in the compact electronics region 466. The electronics module 464a is coupled with the conductive RF loop 462a. The electronics module 464b is coupled with the conductive RF loop 462b. The electronics module 464c is coupled with the conductive RF loop 462c. The three conductive RF loops 462a, 462b, 462c and the corresponding three electronics modules 464a, 464b, 464c define a corresponding three operatively independent radio frequency coils of the coils module 460. In some embodiments, the three electronics modules 464a, 464b, 464c of the coils module 460 are supported by a common printed circuit board 470 (drawn using dotted lines) disposed in the compact electronics region 466. In other embodiments, each of the three electronics modules 464a, 464b, 464c has its own printed circuit board or other supporting substrate.

As seen in FIG. 6B, the example radio frequency coil array 433 is constructed as a staggered two-dimensional array of four partially overlapping coils modules 460 disposed on or in a fabric or other flexible substrate 476. Since each coils module 460 includes three operatively independent radio frequency coils, the array of four partially overlapping coils modules 460 includes twelve operatively independent radio frequency coils. Other radio frequency coil arrays can be constructed including more or fewer coils modules 460. In some embodiments, the coils modules 460 are not overlapping. Gaps between the coils modules 460 of the RF coil array 433 define at least three non-parallel flex axes 480, 482, 484 across which the radio frequency coils array 433 is flexible.

Figure 7A:
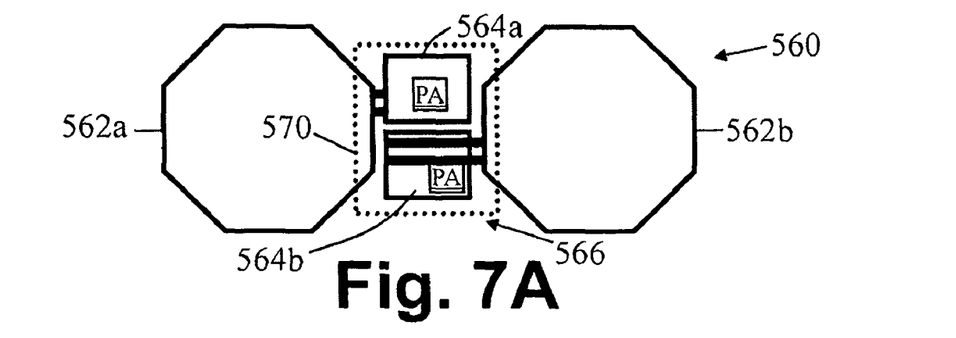
FIG. 7A diagrammatically shows a coils module which includes two non-overlapping independent RF coils.
Figure 7B:
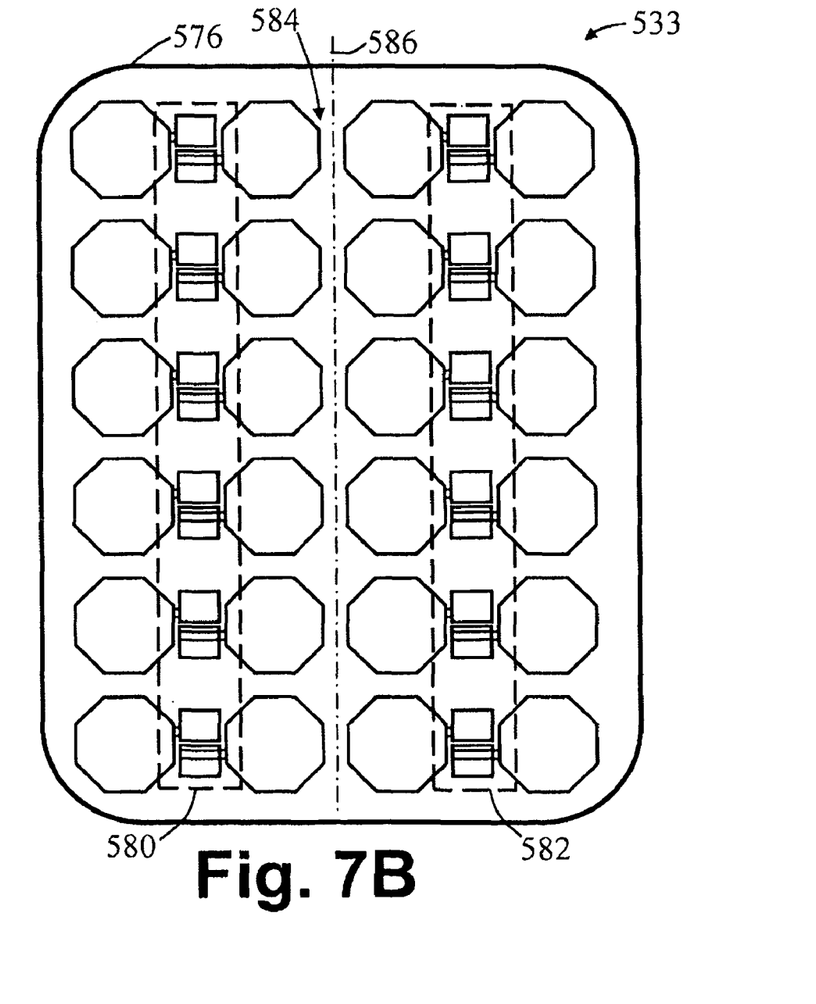
FIG. 7B diagrammatically shows a twenty-four element non-overlapping coil array constructed using a 2×6 array of the coils modules of FIG. 7A, in which six coils modules are arranged with their electronics modules on a first printed circuit board and six coils modules are arranged with their electronics modules on a second spaced apart parallel printed circuit board.

With reference to FIGS. 7A and 7B, another example RF coil array 533 as a spatial arrangement of a plurality of non-overlapping coils modules 560. The example coils array 533 shown in FIG. 7B includes twelve coils modules 560, one of which is depicted in FIG. 7A. The example coils module 560 includes two conductive RF loops 562a, 562b configured to excite or receive magnetic resonance signals. The two conductive RF loops 562a, 562b are arranged as a linear array. Each of the conductive RF loops 562a, 562b has a corresponding electronics module 564a, 564b disposed in a compact electronics region 566 located within the linear array of conductive RF loops 562a, 562b. The two electronics modules 564a, 564b are arranged linearly in the compact electronics region 566 in a direction transverse to the linear array of the conductive RF loops 562a, 562b. The electronics modules 564a, 564b are coupled with the conductive RF loops 562a, 562b, respectively, and define two operatively independent radio frequency coils of the coils module 560. In some embodiments, the two electronics modules 564a, 564b of the coils module 560 are supported by a common printed circuit board 570 (drawn using dotted lines) disposed in the compact electronics region 566. In other embodiments, each of the two electronics modules 564a, 564b has its own printed circuit board or other supporting substrate, or are supported by common printed circuit boards as illustrated in FIG. 7B.

As seen in FIG. 7B, the example radio frequency coil array 533 is constructed as a 2×6 array of twelve partially overlapping coils modules 560 disposed on or in a fabric or other flexible substrate 576. Since each coils module 560 includes two operatively independent radio frequency coils, the 2×6 array of partially overlapping coils modules 560 includes twenty-four operatively independent radio frequency coils. Other radio frequency coil arrays can be constructed including more or fewer coils modules 560. In the illustrated coils array 533, the coils modules 560 are non-overlapping; however, the coils can be partially overlapped to produce a more compact coils array. The arrangement can in general be any n×m array of coils modules 560 where n and m are integers, or can be a non-rectangular arrangement of a plurality of coils modules 560. If only two operatively independent radio frequency coils are desired, then the radio frequency coil array can consist of a single coils module 560.

In the 2×6 arrangement of coils modules 560, a first printed circuit board 580 (drawn using dashed lines) optionally spans the compact electronics regions of six neighboring coils modules 560 and supports the electronics modules of the those six coils modules, while a second printed circuit board 582 spaced apart from the first printed circuit board 580 spans the compact electronics regions of six other neighboring coils modules 560 and supports the electronics modules of those six other neighboring coils modules 560. A gap 584 is present between the first and second printed circuit boards 580, 582 that defines a flexible portion of the radio frequency coils array 533 that can be flexed along a flex axis 586. RF cables (not shown in FIG. 7B, but similar to the RF cables 172, 174 of FIG. 3B) can conveniently extend from the circuit boards 580, 582, respectively.

The foregoing modules and arrays are given by way of example. Other module arrays and circuit placements are also contemplated, including shared and distributed circuits. The arrays can be larger or smaller than those depicted in the drawings, and can have different geometries than those depicted, and may include symmetric or asymmetric patterns. Moreover, the coils arrays can be configured as the illustrated torso coil, or can be configured as an arm coil, a leg coil, a neck coil, or so forth.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency coils array comprising;
   a coil module defined by:
      a plurality of conductive RF loops configured to excite or receive magnetic resonance signals, and
      a plurality of electronics modules corresponding to the plurality of conductive RF loops, the electronics modules grouped together in a compact electronics region, each conductive RF loop operatively connected with a corresponding electronics module, each electronics module including at least a pre-amplifier.

2. The radio frequency coils array as set forth in claim 1, further including:
   a radio frequency cable extending from the compact electronics region and defining a plurality of conductive radio frequency paths corresponding to the plurality of conductive RF loops, each radio frequency path connecting with one of the electronics modules to conduct a radio frequency signal corresponding to a radio frequency excitation delivered to or a magnetic resonance signal received by the corresponding conductive RF loop.

3. The radio frequency coils array as set forth in claim 1, further including:
   a flexible substrate, the coil module being disposed on or in the flexible substrate.

4. The radio frequency coils array as set forth in claim 1, wherein the plurality of conductive RF loops defining the coil module consists of two conductive RF loops, and the corresponding plurality of electronics modules consists of two electronics modules.

5. The radio frequency coils array as set forth in claim 1, wherein the plurality of conductive RF loops defining the coil module consists of three conductive RF loops, and the corresponding plurality of electronics modules consists of three electronics modules.

6. The radio frequency coils array as set forth in claim 1, wherein the plurality of conductive RF loops defining the coil module consists of four conductive RF loops, and the corresponding plurality of electronics modules consists of four electronics modules.

7. The radio frequency coils array as set forth in claim 6, wherein the four electronics modules defining the coil module are arranged as a 2×2 array in the compact electronics region, and the four conductive RF loops are arranged as a 2×2 array.

8. The radio frequency coils array as set forth in claim 1, further including:
   a printed circuit board disposed in the compact electronics region and supporting the plurality of electronics modules.

9. The radio frequency coils array as set forth in claim 1, wherein the plurality of conductive RF loops and corresponding plurality of electronics modules define a corresponding plurality of operatively independent radio frequency coils.

10. The radio frequency coils array as set forth in claim 1, wherein the radio frequency coils array further including:
    a plurality of said coils modules spatially arranged to define the radio frequency coils array.

11. The radio frequency coils array as set forth in claim 10, wherein in the spatial arrangement at least some conductive RF loops of one coils module of the spatial arrangement, spatially overlap conductive RF loops of a neighboring coils module.

12. The radio frequency coils array as set forth in claim 10, wherein the spatial arrangement defines at least one flex axis across which the radio frequency coils array is flexible.

13. The radio frequency coils array as set forth in claim 12, wherein in the spatial arrangement the electronics modules of coils modules arranged parallel with the flex axis are disposed on a common printed circuit board.

14. The radio frequency coils array as set forth in claim 10, wherein the spatial arrangement defines at least two transverse flex axes across which the radio frequency coils array is flexible.

15. The radio frequency coils array as set forth in claim 10, wherein the spatial arrangement defines at least two non-parallel flex axes across which the radio frequency coils array is flexible.

16. A radio frequency coils array comprising:
    a plurality of coils modules spatially arranged to define the radio frequency coils array, a coil module of the plurality of coil modules being defined by:
       a plurality of conductive RF loops configured to excite or receive magnetic resonance signals, and
       a plurality of electronics modules corresponding to the plurality of conductive RF loops, the electronics modules grouped together in a compact electronics region, each conductive RF loop operatively connected with a corresponding electronics module, each electronics module including at least a pre-amplifier;
a first printed circuit board spanning the compact electronics regions of at least two neighboring coils modules and supporting the electronics modules of the at least two neighboring coils modules; and
a second printed circuit board spaced apart from the first printed circuit board and spanning with the compact electronics regions of at least two other neighboring coils modules and supporting the electronics modules of the at least two other neighboring coils modules, a gap between the first and second printed circuit boards defining a flexible portion of the radio frequency coils array.

17. A radio frequency coils array comprising:
a plurality of coils modules spatially arranged to define the radio frequency coils array, a coil module of the plurality of coil modules being defined by:
    a plurality of conductive RF loops configured to excite or receive magnetic resonance signals, and
    a plurality of electronics modules corresponding to the plurality of conductive RF loops, the electronics modules grouped together in a compact electronics region, each conductive RF loop operatively connected with a corresponding electronics module, each electronics module including at least a pre-amplifier; and
a flexible substrate, the coils modules being disposed on or in the flexible substrate.

18. The radio frequency coils array as set forth in claim 17, wherein gaps between the compact electronics regions of at least some neighboring coils modules define flexible portions of the radio frequency coils array.

19. The radio frequency coils array as set forth in claim 17, further including:
one or more printed circuit boards supporting the plurality of electronics modules of the coils modules.

20. The radio frequency coils array as set forth in claim 19, wherein the printed circuit boards are semi-rigid printed circuit boards.

21. A magnetic resonance system comprising:
a main magnet producing a static $B_0$ magnetic field;
magnetic field gradient coils superimposing selected magnetic field gradients on the static $B_0$ magnetic field; and
a radio frequency coils array as set forth in claim 1.

* * * * *